(12) United States Patent
Takasaki et al.

(10) Patent No.: US 10,470,297 B2
(45) Date of Patent: Nov. 5, 2019

(54) PRINTED CIRCUIT BOARD AND ELECTRONIC COMPONENT

(71) Applicant: SUMITOMO ELECTRIC PRINTED CIRCUITS, INC., Shiga (JP)

(72) Inventors: Aya Takasaki, Shiga (JP); Yoshihito Yamaguchi, Shiga (JP)

(73) Assignee: SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 15/765,658

(22) PCT Filed: Oct. 3, 2016

(86) PCT No.: PCT/JP2016/079278
§ 371 (c)(1),
(2) Date: Apr. 3, 2018

(87) PCT Pub. No.: WO2017/061374
PCT Pub. Date: Apr. 13, 2017

(65) Prior Publication Data
US 2019/0082530 A1 Mar. 14, 2019

(30) Foreign Application Priority Data
Oct. 6, 2015 (JP) .................. 2015-198201

(51) Int. Cl.
*H05K 1/02* (2006.01)
*H05K 3/28* (2006.01)
(Continued)

(52) U.S. Cl.
CPC ............. *H05K 1/0253* (2013.01); *H05K 3/28* (2013.01); *H05K 3/4611* (2013.01);
(Continued)

(58) Field of Classification Search
None
See application file for complete search history.

(56) References Cited

U.S. PATENT DOCUMENTS 5,639,990 A * 6/1997 Nishihara ............. H01L 23/043
174/260
5,750,926 A * 5/1998 Schulman ............ A61N 1/3754
174/564
(Continued)

FOREIGN PATENT DOCUMENTS

JP H02-120153 A 5/1990
JP 2003-086728 A 3/2003
(Continued)

OTHER PUBLICATIONS

International Search Report dated Oct. 25, 2016, issued in corresponding International Patent Application No. PCT/JP2016/079278. (4 pages).

*Primary Examiner* — Xanthia C Cunningham
(74) *Attorney, Agent, or Firm* — Fitch, Even, Tabin & Flannery LLP (57) ABSTRACT

A printed circuit board according to an embodiment of the present invention, which is configured to be disposed on an inner surface of an airtight case having an opening so as to hermetically cover the opening, includes a shielding layer containing a liquid crystal polymer as a main component at least in a region covering the opening. An electronic component according to another embodiment of the present invention includes an airtight case having an opening and a printed circuit board disposed on an inner surface of the airtight case so as to hermetically cover the opening, wherein the printed circuit board includes a shielding layer containing a liquid crystal polymer as a main component at least in a region covering the opening.

7 Claims, 3 Drawing Sheets (51) Int. Cl.
*H05K 3/46* (2006.01)
*H05K 1/03* (2006.01)

(52) U.S. Cl.
CPC ......... *H05K 3/4676* (2013.01); *H05K 1/0326* (2013.01); *H05K 1/0346* (2013.01); *H05K 2201/0141* (2013.01); *H05K 2201/2009* (2013.01)

(56) References Cited

U.S. PATENT DOCUMENTS

| | | | | |
|---|---|---|---|---|
| 7,304,429 | B2* | 12/2007 | Kawase | H01J 5/24 313/504 |
| 7,932,594 | B2* | 4/2011 | Maeda | B81B 7/0064 257/693 |
| 7,975,378 | B1 | 7/2011 | Dutta | |
| 9,564,569 | B1* | 2/2017 | Wang | H01L 35/02 |
| 2001/0004129 | A1* | 6/2001 | Tsukiyama | H01L 23/66 257/684 |
| 2003/0024633 | A1* | 2/2003 | Ogura | H01L 23/66 156/250 |
| 2005/0023661 | A1* | 2/2005 | Matsubara | H01L 21/50 257/678 |
| 2005/0184637 | A1* | 8/2005 | Sugawara | H01J 29/862 313/477 R |
| 2005/0194174 | A1* | 9/2005 | Hipwell, Jr. | G11B 33/12 174/61 |
| 2005/0206299 | A1* | 9/2005 | Nakamura | H01J 29/90 313/495 |
| 2005/0238908 | A1* | 10/2005 | Hikmet | H01L 51/5259 428/690 |
| 2007/0205709 | A1* | 9/2007 | Kato | H01J 7/186 313/495 |
| 2007/0222335 | A1* | 9/2007 | Nakano | H03H 9/02559 310/313 A |
| 2007/0279885 | A1* | 12/2007 | Basavanhally | B81B 7/0051 361/799 |
| 2008/0113164 | A1* | 5/2008 | Yamashita | B81B 7/0048 428/209 |
| 2009/0277662 | A1* | 11/2009 | Shiue | A63B 33/002 174/50.51 |
| 2010/0013740 | A1* | 1/2010 | Tanaka | H01L 51/5237 345/32 |
| 2010/0245179 | A1* | 9/2010 | Puzella | H01Q 1/02 343/702 |
| 2010/0261961 | A1* | 10/2010 | Scott | A61B 1/00193 600/111 |
| 2011/0037162 | A1* | 2/2011 | Sichenzia | H01L 23/055 257/692 |
| 2011/0038132 | A1* | 2/2011 | Ochiai | B81C 1/00269 361/760 |
| 2012/0006989 | A1* | 1/2012 | Maston | G01J 5/041 250/340 |
| 2015/0021748 | A1* | 1/2015 | Sasaki | H01L 23/66 257/664 |
| 2016/0165327 | A1* | 6/2016 | Crosby | H04R 1/2811 381/332 |
| 2016/0329484 | A1* | 11/2016 | Iizuka | H03H 9/1035 |
| 2017/0127543 | A1* | 5/2017 | Day | A61J 1/00 |

FOREIGN PATENT DOCUMENTS

| | | |
|---|---|---|
| JP | 2011-210307 A | 10/2011 |
| JP | 2014-216449 A | 11/2014 |
| JP | 2015-019010 A | 1/2015 |
| JP | 2015019010 A * | 1/2015 |
| WO | 2007/149046 A1 | 12/2007 |

* cited by examiner

PRINTED CIRCUIT BOARD AND ELECTRONIC COMPONENT

CROSS-REFERENCE TO RELATED APPLICATIONS

This application is a U.S. national phase application filed under 35 U.S.C. § 371 of International Application PCT/JP2016/079278, filed on Oct. 3, 2016, designating the United States, which claims priority from Japanese Application Number 2015-198201, filed Oct. 6, 2015, which are hereby incorporated herein by reference in their entirety.

TECHNICAL FIELD

The present invention relates to a printed circuit board and an electronic component.

BACKGROUND ART

Printed circuit boards are hitherto used for connection to connector terminals. Furthermore, there are some printed circuit boards which are configured to be placed so as to cover an opening of a case in order to separate the inside from the outside of the case.

A printed circuit board which is configured to be placed so as to cover an opening of a case, for example, includes a base film made of a polyimide, a copper foil placed on the base film, and an insulating layer which covers a surface of the copper foil (refer to Japanese Unexamined Patent Application Publication No. 2011-210307).

CITATION LIST

Patent Literature

PTL 1: Japanese Unexamined Patent Application Publication No. 2011-210307

SUMMARY OF INVENTION

A printed circuit board according to an embodiment of the present invention, which is configured to be disposed on an inner surface of an airtight case having an opening so as to hermetically cover the opening, includes a shielding layer containing a liquid crystal polymer as a main component at least in a region covering the opening.

An electronic component according to another embodiment of the present invention includes an airtight case having an opening and a printed circuit board disposed on an inner surface of the airtight case so as to hermetically cover the opening, wherein the printed circuit board includes a shielding layer containing a liquid crystal polymer as a main component at least in a region covering the opening.

DESCRIPTION OF EMBODIMENTS

[Problems to be Solved by the Present Disclosure]

In the existing printed circuit board, moisture is likely to permeate into the inside of a base film or the like. Accordingly, when such a printed circuit board is placed over an opening of an airtight case, there is a concern that moisture may enter the airtight case through the printed circuit board, leading to a malfunction of an electronic component provided with the airtight case.

The present invention has been made under these circumstances. It is an object of the invention to provide a printed circuit board and an electronic component which can maintain a hermetic state in an airtight case.

[Advantageous Effects of the Present Disclosure]

A printed circuit board and an electronic component according to the present invention can maintain a hermetic state in an airtight case.

[DESCRIPTION OF EMBODIMENTS OF THE PRESENT INVENTION]

First, the embodiments of the present invention will be described below one by one.

A printed circuit board according to an embodiment of the present invention, which is configured to be disposed on an inner surface of an airtight case having an opening so as to hermetically cover the opening, includes a shielding layer containing a liquid crystal polymer as a main component at least in a region covering the opening.

In the printed circuit board, since the main component of the shielding layer is a liquid crystal polymer, by decreasing the moisture vapor transmission rate of the shielding layer, permeation of moisture into the shielding layer can be prevented. Therefore, in the printed circuit board, by providing the shielding layer in a region covering the opening of the airtight case, it is possible to prevent entry of moisture from the outside into the airtight case. Accordingly, the printed circuit board can maintain the hermetic state in the airtight case.

Preferably, the shielding layer has an average thickness of 20 to 500 μm. When the average thickness of the shielding layer is in the range described above, entry of moisture into the airtight case can be easily and reliably prevented.

The printed circuit board may further include a stiffener disposed on a surface of the shielding layer opposite to the side that is disposed on the airtight case. Thus, since the printed circuit board includes a stiffener disposed on a surface of the shielding layer opposite to the side that is disposed on the airtight case, while preventing entry of moisture from the outside into the airtight case, by preventing deflection of the printed circuit board, the hermetic state in the airtight case can be more appropriately maintained.

The shielding layer may substitute for an impedance adjustment layer. Thus, since the shielding layer substitutes for an impedance adjustment layer, the shielding layer can be formed relatively thickly in order to obtain a desired characteristic impedance. Therefore, the function of preventing entry of moisture into the airtight case can be easily enhanced. Furthermore, in the case where the shielding layer substitutes for an impedance adjustment layer, since it is not necessary to provide a shielding layer separately from the impedance adjustment layer, it is possible to prevent an increase in the thickness of the printed circuit board due to providing a shielding layer.

The shielding layer may be placed at a position where the distance from an outer surface to be disposed on the inner surface of the airtight case is 300 µm or less. Thus, since the distance from the outer surface to be disposed on the inner surface of the airtight case is equal to or less than the upper limit, it is possible to more reliably prevent entry of moisture into the airtight case from between the shielding layer and the inner surface of the airtight case.

Preferably, the printed circuit board includes one or a plurality of polyimide layers located between the outer surface to be disposed on the inner surface of the airtight case and the shielding layer, and preferably, the one or a plurality of polyimide layers have a total average thickness of 100 µm or less. Thus, since the printed circuit board includes one or a plurality of polyimide layers located between the outer surface to be disposed on the inner surface of the airtight case and the shielding layer, characteristics such as insulation properties can be easily and reliably improved. Furthermore, since the total average thickness of the polyimide layers is equal to or less than the upper limit, it is possible to easily prevent permeation of moisture from the edges of the polyimide layers into the polyimide layers, and as a result, the effect of preventing entry of moisture into the airtight case can be promoted.

An electronic component according to an embodiment of the present invention includes an airtight case having an opening and a printed circuit board disposed on an inner surface of the airtight case so as to hermetically cover the opening, wherein the printed circuit board includes a shielding layer containing a liquid crystal polymer as a main component at least in a region covering the opening.

In the electronic component, since the printed circuit board including the shielding layer containing a liquid crystal polymer as a main component is disposed on the inner surface of the airtight case so as to hermetically cover the opening, it is possible to prevent entry of moisture from the outside into the airtight case. Accordingly, in the electronic component, the hermetic state in the airtight case can be maintained.

Note that, in the present invention, the term "region covering the opening" refers to a region overlapping the opening when viewed in plan. The term "main component" refers to a component whose content is the largest, for example, a component with a content of 50% by mass or more, preferably 80% by mass or more. The term "average thickness" refers to an average of thickness measurements at arbitrary 10 points. The term "impedance adjustment layer" refers to a layer having electrical insulation properties which is provided to adjust the characteristic impedance. The term "polyimide layer" refers to a layer containing a polyimide as a main component. Furthermore, the term "hermetic state" refers to a state in which entry of moisture from the outside into the airtight case is prevented.

[Detailed Description of Embodiments of the Present Invention]

Printed circuit boards and electronic components according to the embodiments of the present invention will be described below with reference to the drawings appropriately.

<Printed Circuit Board>

Figure 1:
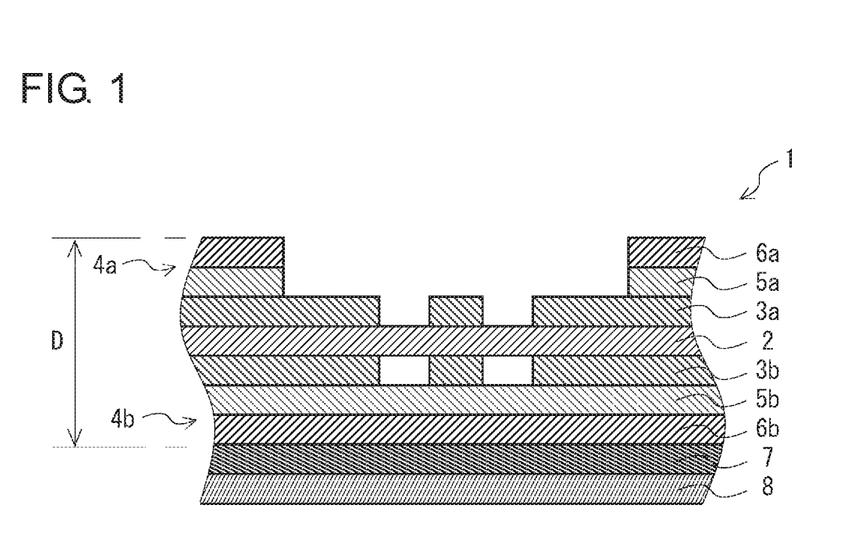
FIG. 1 is a schematic cross-sectional view showing a printed circuit board according to an embodiment of the present invention.

A printed circuit board 1 of FIG. 1 is configured to be disposed on an inner surface of an airtight case having an opening so as to hermetically cover the opening. The printed circuit board 1 of FIG. 1 is configured as a flexible printed circuit board having flexibility. The printed circuit board 1 of FIG. 1 electrically connects external connectors to elements inside the airtight case. The printed circuit board 1 of FIG. 1 includes a base film 2, a pair of conductive patterns 3a and 3b disposed on both surfaces of the base film 2, a pair of coverlays 4a and 4b disposed on outer surfaces of the pair of conductive patterns 3a and 3b, and a shielding layer 7 disposed on an outer surface of the coverlay 4b. Furthermore, the printed circuit board 1 of FIG. 1 includes a stiffener 8 disposed on an outer surface of the shielding layer 7. Note that, in the printed circuit board 1 of FIG. 1, an outer surface of the coverlay 4a (the outer surface opposite to the stiffener 8) is disposed on the inner surface of the airtight case. Furthermore, the "outer surface" in the printed circuit board 1 refers to a surface located on the outer side when the base film 2 is regarded as a center.

(Base Film)

The base film 2 has insulation properties and flexibility. As a main component of the base film 2, a synthetic resin, such as a polyimide, polyethylene terephthalate, fluororesin, or liquid crystal polymer, may be used. In particular, preferably, the base film 2 is formed as a polyimide layer containing a polyimide as a main component. When the base film 2 is formed as the polyimide layer, it is possible to easily and reliably improve insulation properties, flexibility, heat resistance, and the like.

In the case where the base film 2 is not formed as a polyimide layer, the lower limit of the average thickness of the base film 2 is preferably 5 µm, more preferably 12 µm, and still more preferably 20 µm. On the other hand, in the case where the base film 2 is not formed as a polyimide layer, the upper limit of the average thickness of the base film 2 is preferably 500 µm, more preferably 100 µm, and still more preferably 50 µm. When the average thickness of the base film 2 is less than the lower limit, there is a concern that insulation properties and mechanical strength may become insufficient. Contrarily, when the average thickness of the base film 2 exceeds the upper limit, there is a concern that moisture may permeate from the edges of the base film 2 into the base film 2, and the moisture may enter the airtight case. Furthermore, when the average thickness of the base film 2 exceeds the upper limit, there is a concern that the flexibility of the printed circuit board 1 may become insufficient.

On the other hand, in the case where the base film 2 is formed as a polyimide layer, the upper limit of the average thickness of the base film 2 is preferably 50 µm, more preferably 25 µm, and still more preferably 12 µm. While being able to easily and reliably improve insulation properties, flexibility, heat resistance, and the like, the polyimide is likely to allow moisture to pass therethrough. However, by setting the average thickness of the base film 2 to be equal to or less than the upper limit, it is possible to sufficiently suppress permeation of moisture from the edges of the base film 2 into the base film 2 and entry of the moisture into the airtight case. Furthermore, in the case where the base film 2 is formed as a polyimide layer, the lower limit of the average thickness of the base film 2 is preferably 5 µm, and more preferably 10 µm. When the average thickness of the base film 2 is less than the lower limit, there is a concern that insulation properties and mechanical strength may become insufficient.

(Conductive Pattern)

The conductive patterns 3a and 3b form circuits of the printed circuit board 1. As a main component of the conductive patterns 3a and 3b, copper such as oxygen-free copper, aluminum, silver, gold, nickel, or an alloy thereof, stainless steel, or the like may be used. Among these, copper and a copper alloy are preferable, and copper is more preferable.

The lower limit of the average thickness of the conductive patterns 3a and 3b is preferably 1 µm, more preferably 5 µm, and still more preferably 10 µm. On the other hand, the upper limit of the average thickness of the conductive patterns 3a and 3b is preferably 500 µm, more preferably 100 µm, or still more preferably 50 µm. When the average thickness of the conductive patterns 3a and 3b is less than the lower limit, there is a concern that the strength of the conductive patterns 3a and 3b may decrease. Contrarily, when the average thickness of the conductive patterns 3a and 3b exceeds the upper limit, there is a concern that the thickness of the printed circuit board 1 may excessively increase.

Furthermore, the conductive patterns 3a and 3b may have metal plating layers on the surfaces on which the coverlays 4a and 4b, which will be described later, are disposed. Examples of the metal constituting the metal plating layer include highly conductive copper, nickel, silver, and the like. Furthermore, for example, the average thickness of the metal plating layer can be set to be 1 to 50 µm.

Although the printed circuit board 1 includes a pair of conductive patterns 3a and 3b on both surfaces of the base film 2, the conductive patterns 3a and 3b do not necessarily contain the same main component. Furthermore, the conductive patterns 3a and 3b may have different average thicknesses, and one of the conductive patterns (for example, the conductive pattern 3a placed on the airtight case side) only may have a metal plating layer.

(Coverlay)

The coverlays 4a and 4b are provided mainly for the purpose of protecting the conductive patterns 3a and 3b. The coverlays 4a and 4b are each a two-layer structure. The coverlay 4a includes an adhesive layer 5a disposed on the outer surface of the conductive pattern 3a and an insulating layer 6a disposed on the outer surface of the adhesive layer 5a, and the coverlay 4b includes an adhesive layer 5b disposed on the outer surface of the conductive pattern 3b and an insulating layer 6b disposed on the outer surface of the adhesive layer 5b. The coverlay 4a placed on the airtight case side has an opening portion, and the conductive pattern 3a is exposed outside at the opening portion.

The adhesive layers 5a and 5b bond the conductive patterns 3a and 3b to the insulating layers 6a and 6b, respectively. The adhesive constituting the adhesive layers 5a and 5b is not particularly limited, but preferably has excellent flexibility and heat resistance. Examples thereof include various resin-based adhesives, such as a nylon resin, an epoxy resin, a butyral resin, and an acrylic resin.

The lower limit of the average thickness of the adhesive layers 5a and 5b is preferably 5 µm, and more preferably 10 µm. On the other hand, the upper limit of the average thickness of the adhesive layers 5a and 5b is preferably 50 µm, and more preferably 40 µm. When the average thickness of the adhesive layers 5a and 5b is less than the lower limit, sufficient adhesion strength between the conductive patterns 3a and 3b and the insulating layers 6a and 6b may not be obtained. Contrarily, when the average thickness of the adhesive layers 5a and 5b exceeds the upper limit, there is a concern that moisture may permeate from the edges of the adhesive layers 5a and 5b into the adhesive layers 5a and 5b, and the moisture may enter the airtight case. Furthermore, when the average thickness of the adhesive layers 5a and 5b exceeds the upper limit, there is a concern that the flexibility of the printed circuit board 1 may become insufficient.

The insulating layers 6a and 6b have insulation properties and flexibility and protect the conductive patterns 3a and 3b from the outer surface side. As a main component of the insulating layers 6a and 6b, a synthetic resin, such as a polyimide, polyethylene terephthalate, fluororesin, or liquid crystal polymer, may be used. In particular, preferably, the insulating layers 6a and 6b are formed as polyimide layers containing a polyimide as a main component. When the insulating layers 6a and 6b are formed as the polyimide layers, it is possible to easily and reliably improve insulation properties, flexibility, heat resistance, and the like.

In the case where the insulating layers 6a and 6b are not formed as polyimide layers, the lower limit of the average thickness of the insulating layers 6a and 6b is preferably 5 µm, and more preferably 10 µm. On the other hand, in the case where insulating layers 6a and 6b are not formed as polyimide layers, the upper limit of the average thickness of the insulating layers 6a and 6b is preferably 50 µm, and more preferably 40 µm. When the average thickness of the insulating layers 6a and 6b is less than the lower limit, there is a concern that insulation properties may become insufficient. Contrarily, when the average thickness of the insulating layers 6a and 6b exceeds the upper limit, there is a concern that moisture may permeate from the edges of the insulating layers 6a and 6b into the insulating layers 6a and 6b, and the moisture may enter the airtight case. Furthermore, when the average thickness of the insulating layers 6a and 6b exceeds the upper limit, there is a concern that the flexibility of the printed circuit board 1 may become insufficient.

On the other hand, in the case where the insulating layers 6a and 6b are formed as polyimide layers, the upper limit of the average thickness of the insulating layers 6a and 6b is preferably 50 µm, more preferably 30 µm, and still more preferably 25 µm. Even in the case where the insulating layers 6a and 6b are formed as polyimide layers, by setting the average thickness of the insulating layers 6a and 6b to be equal to or less than the upper limit, it is possible to sufficiently suppress permeation of moisture from the edges of the insulating layers 6a and 6b into the insulating layers 6a and 6b and entry of the moisture into the airtight case. Note that the lower limit of the average thickness of the insulating layers 6a and 6b in the case where the insulating layers 6a and 6b are formed as polyimide layers can be the same as that in the case where the insulating layers 6a and 6b are not formed as polyimide layers.

Preferably, the printed circuit board 1 includes one or a plurality of polyimide layers, which consist of the base film 2 and the insulating layers 6a and 6b, located between the outer surface to be disposed on the airtight case and the shielding layer 7. Furthermore, the upper limit of the total average thickness of the one or a plurality of polyimide layers is preferably 100 µm, and more preferably 75 µm. When the printed circuit board 1 includes one or a plurality of polyimide layers located between the outer surface and the shielding layer, insulation properties, flexibility, and the like can be easily and reliably improved. Furthermore, in the printed circuit board 1, when the total average thickness of the polyimide layers is equal to or less than the upper limit, it is possible to sufficiently prevent moisture that has permeated from the edges of the polyimide layers into the polyimide layers from entering the case. Note that the lower limit of the total average thickness of the one or a plurality of polyimide layers, for example, can be set to be 15 µm.

(Shielding Layer)

The shielding layer 7 is placed at least in a region covering the opening of the airtight case. That is, the shielding layer 7 covers the entire region overlapping the opening of the air tight case when viewed in plan. Furthermore, the printed circuit board 1 is configured such that outer edges of the coverlay 4a to be disposed on the inner surface of the airtight case and constituting an outermost layer of the printed circuit board 1 on the side to be disposed on the inner surface of the airtight case, the shielding layer 7, and all the layers disposed between these layers are located outside the opening of airtight case when viewed in plan.

The shielding layer 7 has insulation properties and flexibility and contains a liquid crystal polymer as a main component. The liquid crystal polymer hardly allows moisture to permeate therethrough. Therefore, when the shielding layer 7 contains the liquid crystal polymer as a main component, the shielding layer 7 can easily prevent entry of moisture from the outside into the airtight case.

Liquid crystal polymers can be divided into two types: thermotropic and lyotropic. Thermotropic liquid crystal polymers exhibit liquid crystallinity in a molten state, and lyotropic liquid crystal polymers exhibit liquid crystallinity in a solution state. In the present invention, use of a thermotropic liquid crystal polymer is preferable.

The liquid crystal polymer is, for example, an aromatic polyester obtained by combining an aromatic dicarboxylic acid and a monomer, such as an aromatic diol or aromatic hydroxycarboxylic acid. Typical examples thereof include polymers obtained by polymerizing monomers synthesized from p-hydroxybenzoic acid (PHB), terephthalic acid, and 4,4'-biphenol and represented by formulas (1), (2), and (3) below, polymers obtained by polymerizing monomers synthesized from PHB, terephthalic acid, and ethylene glycol and represented by formulas (2), (3), and (5), and polymers obtained by polymerizing monomers synthesized from PHB and 2,6-hydroxynaphthoic acid and represented by formulas (3) and (4) below.

[Chemical formula 1]

(1)

(2)

(3)

-continued (4)

(5)

The liquid crystal polymer is not particularly limited as long as it exhibits liquid crystallinity, and may contain any of the polymers described above as a main component (50 mol % or more in the liquid crystal polymer) and may be copolymerized with another polymer or monomer. Furthermore, the liquid crystal polymer may be a liquid crystalline polyester amide, liquid crystalline polyester ether, liquid crystalline polyester carbonate, or liquid crystalline polyester imide.

A liquid crystalline polyester amide is a liquid crystalline polyester having amide bonds, and examples thereof include polymers obtained by polymerizing monomers represented by formula (6) below and formulas (2) and (4) above.

[Chemical formula 2]

(6)

Preferably, the liquid crystal polymer is produced by melt-polymerizing raw material monomers corresponding to the units constituting the liquid crystal polymer, and subjecting the resulting polymer (prepolymer) to solid-phase polymerization. Thereby, it is possible to produce a high-molecular weight liquid crystal polymer having a low moisture vapor transmission rate and high heat resistance and high strength/stiffness with good operability. The melt polymerization may be performed in the presence of a catalyst. Examples of the catalyst include metal compounds, such as magnesium acetate, stannous acetate, tetrabutyl titanate, lead acetate, sodium acetate, potassium acetate, and antimony trioxide; and nitrogen-containing heterocyclic compounds, such as 4-dimethylaminopyridine and 1-methyl imidazole. Nitrogen-containing heterocyclic compounds are preferably used.

Furthermore, the shielding layer 7 may contain, in addition to the main component, e.g., the liquid crystal polymer, a filler, an additive, and the like.

The upper limit of the moisture vapor transmission rate of the shielding layer 7 is preferably 5 g/m²·day, and more preferably 1 g/m²·day. When the moisture vapor transmission rate of the shielding layer 7 is equal to or less than the upper limit, it is possible to more appropriately prevent entry of moisture into the airtight case. The lower limit of the moisture vapor transmission rate of the shielding layer 7 is not particularly limited, and can be, for example, 0.01 g/m²·day. Furthermore, the moisture vapor transmission rate refers to a value measured in accordance with JIS-K7129 (2008).

The lower limit of the average thickness of the shielding layer 7 is preferably 20 µm, more preferably 50 µm, and still more preferably 100 µm. On the other hand, the upper limit of the average thickness of the shielding layer 7 is preferably 500 μm, more preferably 400 μm, and still more preferably 300 μm. When the average thickness of the shielding layer 7 is less than the lower limit, there is a concern that it may not be possible to sufficiently prevent entry of moisture into the airtight case. Contrarily, when the average thickness of the shielding layer 7 exceeds the upper limit, the effect of preventing entry of moisture into the air tight case is not much improved, and there is a concern that the thickness of the printed circuit board 1 may increase unnecessarily.

The upper limit of the distance D from an outer surface to be disposed on the inner surface of the airtight case (the outer surface of the insulating layer 6a in this embodiment) to the shielding layer 7 is preferably 300 μm, more preferably 260 μm, and still more preferably 230 μm. When the distance D exceeds the upper limit, there is an increased concern that moisture may enter the airtight case from between the shielding layer 7 and the inner surface of the airtight case. The lower limit of the distance D is not particularly limited, and can be, for example, 50 μm.

Preferably, the shielding layer 7 is formed as a layer which substitutes for an impedance adjustment layer. Although the printed circuit board 1 preferably includes an impedance adjustment layer in order to obtain a desired characteristic impedance, when the impedance adjustment layer is substituted for by the shielding layer 7, an increase in the number of parts can be suppressed, and reduction in thickness of the printed circuit board can be promoted. Furthermore, in order to obtain a desired characteristic impedance, it is preferable to form an impedance adjustment layer relatively thickly. Therefore, when the impedance adjustment layer is substituted for by the shielding layer 7, the function of preventing entry of moisture into the airtight case can be easily enhanced.

(Stiffener)

The stiffener 8 is disposed on a surface of the shielding layer 7 opposite to the side that is disposed on the airtight case. The stiffener 8 constitutes an outermost layer of the printed circuit board 1 on the side opposite to the side to be disposed on the airtight case. When installed in an electronic component, as will be described later, the printed circuit board 1 is folded such that portions of the shielding layer 7 face each other with the stiffener 8 therebetween inside. Accordingly, the stiffener 8 is not disposed over the entire outer surface of the shielding layer 7. Specifically, the stiffener 8 is not disposed on regions of the outer surface of the shielding layer 7 which are to be folded.

In the printed circuit board 1, since the stiffener 8 is disposed on a surface of the shielding layer 7 opposite to the side that is disposed on the airtight case, while preventing entry of moisture from the outside into the airtight case, by preventing deflection, the hermetic state in the airtight case can be more appropriately maintained. Furthermore, in the printed circuit board 1, since the stiffener 8 is disposed on a surface of the shielding layer 7 opposite to the side that is disposed on the airtight case, it is possible to facilitate connection to an external connector (not shown).

The stiffener 8 is made of a rigid member. As a material for the stiffener 8, for example, metal, ceramic, wood, resin, or the like may be used. Among these, as a material for the stiffener 8, a metal that can relatively easily enhance stiffness is preferable, and a metal containing aluminum or stainless steel as a main component is particularly preferable.

The lower limit of the average thickness of the stiffener 8 is preferably 100 μm, more preferably 200 μm, and still more preferably 300 μm. On the other hand, the upper limit of the average thickness of the stiffener 8 is preferably 5 mm, more preferably 2 mm, and still more preferably 1 mm. When the average thickness of the stiffener 8 is less than the lower limit, there is a concern that the stiffness of the stiffener 8 may not increase sufficiently. Contrarily, when the average thickness of the stiffener 8 exceeds the upper limit, there is a concern that the requirement for reduction in thickness of the printed circuit board 1 may not be satisfied.

<Advantages>

In the printed circuit board 1, since the main component of the shielding layer 7 is a liquid crystal polymer, by decreasing the moisture vapor transmission rate of the shielding layer 7, permeation of moisture into the shielding layer 7 can be prevented. Therefore, in the printed circuit board 1, by providing the shielding layer 7 in a region covering the opening of the airtight case, it is possible to prevent entry of moisture from the outside into the airtight case. Accordingly, the printed circuit board 1 can maintain the hermetic state in the airtight case.

<Electronic Component>

An electronic component 11 provided with the printed circuit board 1 will be described below with reference to FIGS. 2 and 3.

The electronic component 11 includes mainly an airtight case 12 having an opening X and the printed circuit board 1 disposed on an inner surface of the airtight case 12 so as to hermetically cover the opening X. As shown in FIG. 3, the printed circuit board 1 is folded such that portions of the shielding layer 7 face each other with the stiffener 8 therebetween inside. The folded back portions of the shielding layer 7 are fixed to the stiffener 8 by an adhesive.

Figure 2:
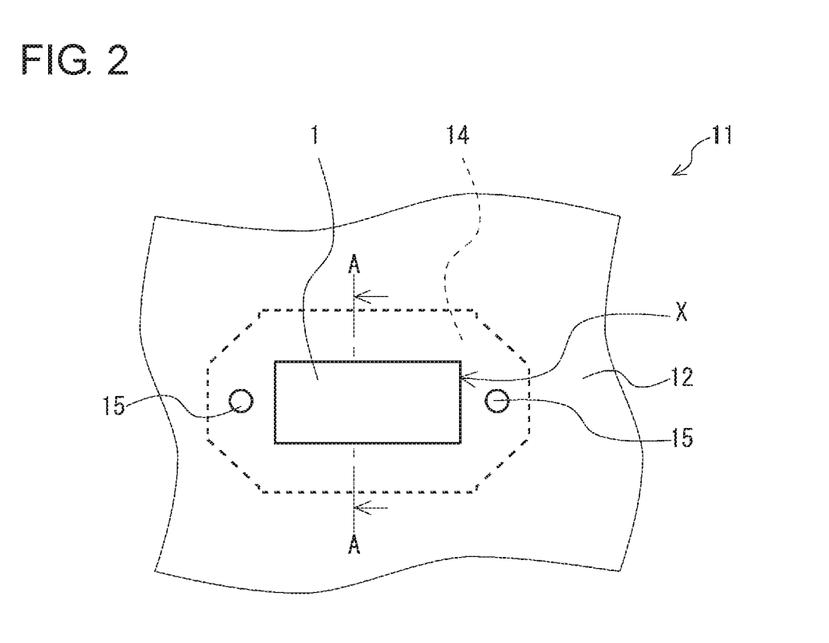
FIG. 2 is a schematic partial plan view showing an outer surface of an electronic component using the printed circuit board shown in FIG. 1.
Figure 3:
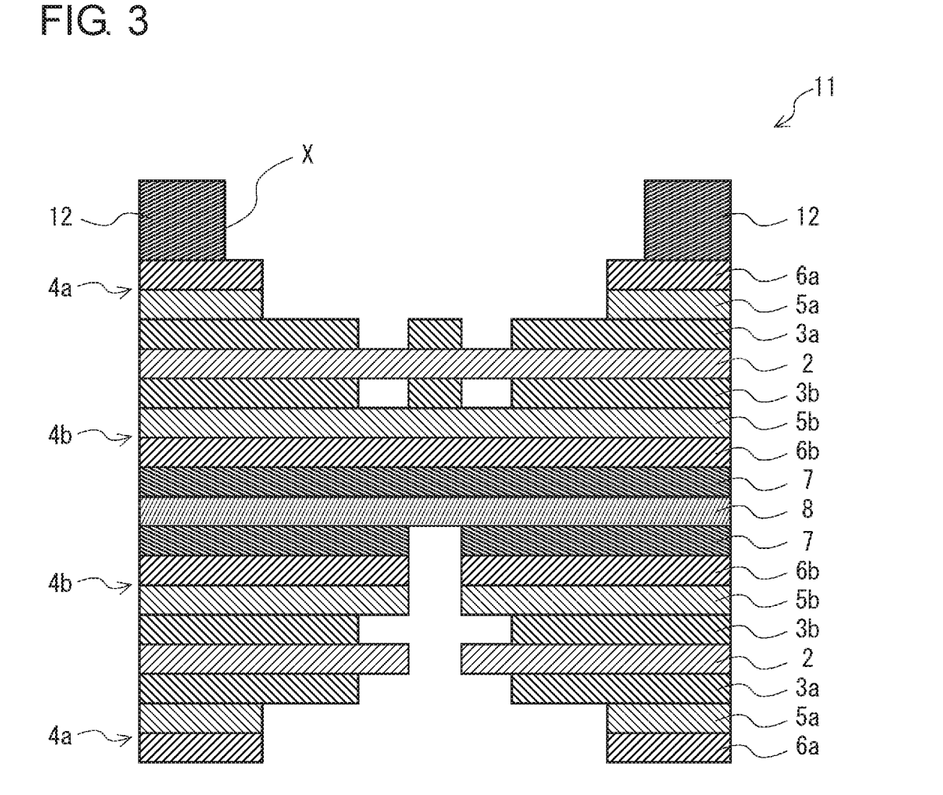
FIG. 3 is an enlarged end view of a portion taken along the line A-A of the electronic component shown in FIG. 2.

Furthermore, as shown in FIG. 2, the electronic component 11 includes a mounting member 14 for mounting the printed circuit board 1 on the airtight case 12 and screws 15 for fixing the mounting member 14 to the airtight case 12. The electronic component 11 includes a shielding layer 7 containing a liquid crystal polymer as a main component at least in a region covering the opening X. Specifically, in the electronic component 11, the shielding layer 7 which is disposed on the airtight case 12 side of the stiffener 8 is placed at least in a region covering the opening X.

(Mounting Structure of Printed Circuit Board)

A mounting structure of the printed circuit board 1 in the electronic component 11 will be described with reference to FIGS. 2 and 3.

The mounting member 14 consists of a pair of mounting plates for sandwiching the printed circuit board 1 from both surfaces. A pair of mounting plates have a window portion corresponding to the opening X for exposing the printed circuit board 1. A pair of mounting plates sandwich the stiffener 8 from both surfaces with the printed circuit board 1 being exposed from the window portion. Specifically, a pair of mounting plates are joined to the stiffener 8, by engagement means such as screws, with the stiffener 8 being sandwiched from both surfaces. Since the mounting member 14 is fixed by the screws 15 to the inner surface of the airtight case 12, the printed circuit board 1 is disposed on the inner surface of the airtight case 12 so as to hermetically cover the opening X. As shown in FIG. 3, the printed circuit board 1 is placed such that the insulating layer 6a on the side opposite to the shielding layer 7 is disposed on the inner surface of the airtight case 12.

<Advantages>

In the electronic component 11, since the printed circuit board 1 is disposed on the inner surface of the airtight case 12 so as to hermetically cover the opening X, it is possible to prevent moisture present outside the airtight case 12 from entering the airtight case 12. Accordingly, in the electronic component 11, the hermetic state in the airtight case 12 can be maintained.

<Method for Manufacturing Printed Circuit Board>

A method for manufacturing the printed circuit board 1 will be described below with reference to FIGS. 4A to 4E. The method for manufacturing the printed circuit board includes a step of laminating conductive layers on both surfaces of a base film 2 (conductive layer lamination step), a step of forming conductive patterns 3a and 3b by subjecting the conductive layers to etching and the like (conductive pattern formation step), a step of laminating coverlays 4a and 4b on outer surfaces of the conductive patterns 3a and 3b (coverlay lamination step), a step of laminating a shielding layer 7 on an outer surface of the coverlay 4b (shielding layer lamination step), and a step of laminating a stiffener 8 on an outer surface of the shielding layer 7 (stiffener lamination step).

(Conductive Layer Lamination Step)

Figure 4A:
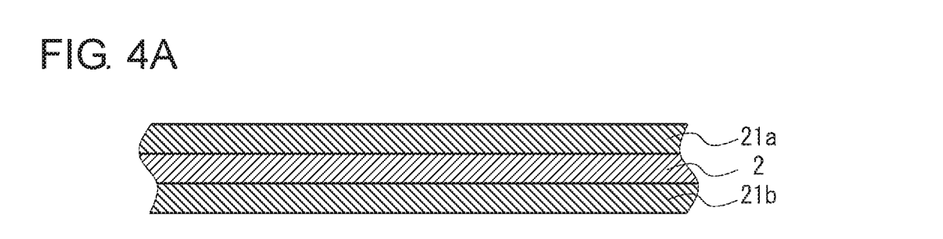
FIG. 4A is a schematic cross-sectional view showing a conductive layer lamination step in a method for manufacturing a printed circuit board according to an embodiment of the present invention.

In the conductive layer lamination step, for example, as shown in FIG. 4A, metal foils 21a and 21b are laminated on both surfaces of the base film 2. As a method of laminating the metal foils 21a and 21b on the base film 2, for example, a method in which the metal foils 21a and 21b are bonded to the base film 2 by an adhesive, a method in which the metal foils 21a and 21b are laid on the base film 2, and then pressing is performed, or the like may be used.

Furthermore, in the conductive layer lamination step, instead of laminating the metal foils 21a and 21b on both surfaces of the base film 2, for example, conductive layers made of sintered bodies of metal particles may be formed by sintering metal particles, such as copper particles, onto both surfaces of the base film 2. Furthermore, in the conductive layer lamination step, metal plating layers may be further disposed on the outer surfaces of the sintered bodies.

(Conductive Pattern Formation Step)

Figure 4B:
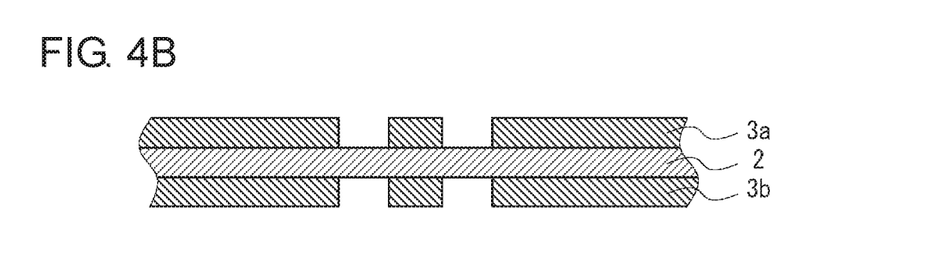
FIG. 4B is a schematic cross-sectional view showing a conductive pattern formation step in a method for manufacturing a printed circuit board according to an embodiment of the present invention.

In the conductive pattern formation step, as shown in FIG. 4B, by subjecting the metal foils 21a and 21b to etching and the like, conductive patterns 3a and 3b are formed. As a method of forming conductive patterns 3a and 3b, a known method may be employed, and for example, a subtractive method may be used. In the subtractive method, resist patterns having a predetermined shape are formed on the outer surfaces of the metal foils 21a and 21b, the metal foils are etched by using the resist patterns as masks, and then the resist patterns are removed, thereby forming conductive patterns 3a and 3b.

(Coverlay Lamination Step)

Figure 4C:
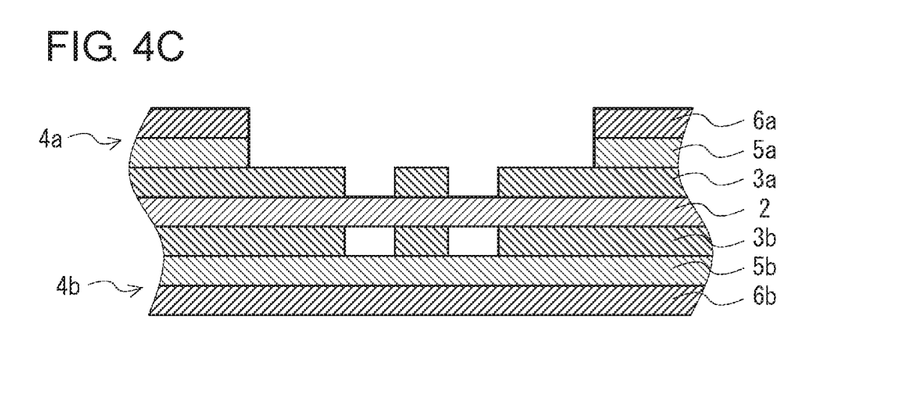
FIG. 4C is a schematic cross-sectional view showing a coverlay lamination step in a method for manufacturing a printed circuit board according to an embodiment of the present invention.

In the coverlay lamination step, as shown in FIG. 4C, adhesive layers 5a and 5b and insulating layers 6a and 6b are laminated in this order on the outer surfaces of the conductive patterns 3a and 3b. In the coverlay lamination step, for example, first, laminated bodies including an adhesive layer 5a or 5b and an insulating layer 6a or 6b are formed. Then, the adhesive layers 5a and 5b of the laminated bodies are disposed on the outer surfaces of the conductive patterns 3a and 3b, and by applying pressure and heat, coverlays 4a and 4b are bonded to the outer surfaces of the conductive patterns 3a and 3b.

The pressure and heat application conditions can be appropriately changed depending on the type of adhesive constituting the adhesive layers 5a and 5b. The applied pressure can be, for example, 1 to 5 MPa. The heating temperature can be, for example, 150° C. to 200° C., and the heating time can be, for example, 30 minutes to one hour.

(Shielding Layer Lamination Step)

Figure 4D:
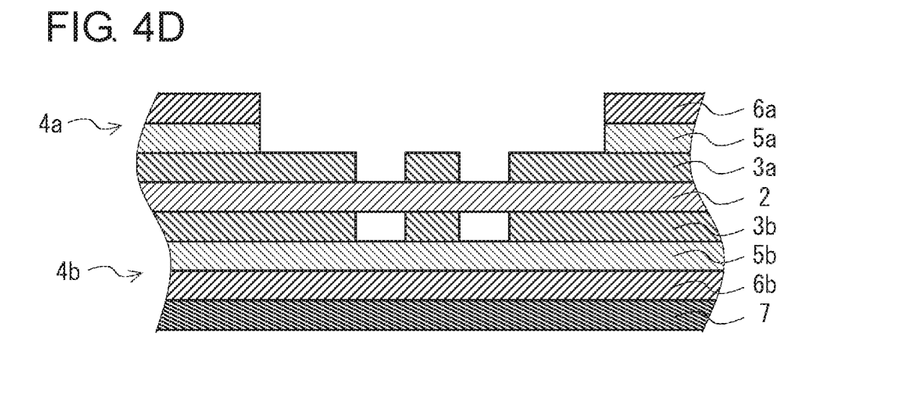
FIG. 4D is a schematic cross-sectional view showing a shielding layer lamination step in a method for manufacturing a printed circuit board according to an embodiment of the present invention.

In the shielding layer lamination step, as shown in FIG. 4D, a shielding layer 7 is laminated to the outer surface of the coverlay 4b. The method of laminating the shielding layer 7 is not particularly limited, and for example, a bonding method with an adhesive may be used. The average thickness of an adhesive layer that bonds the coverlay 4b to the shielding layer 7 can be, for example, 10 to 70 μm.

(Stiffener Lamination Step)

Figure 4E:
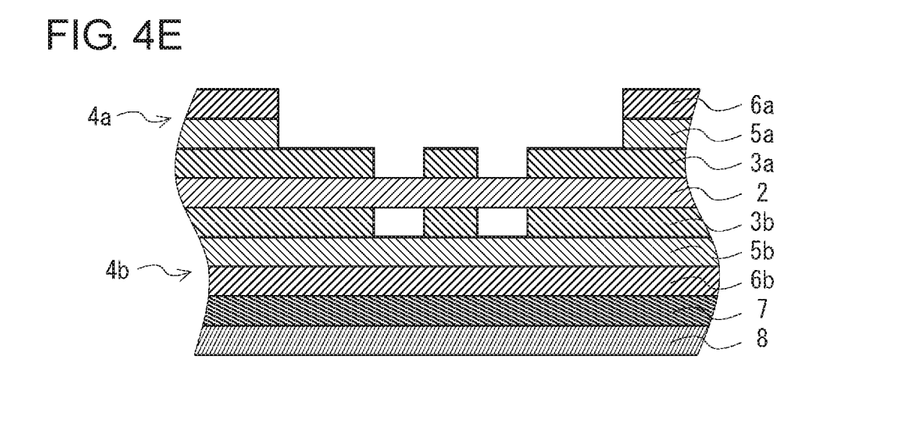
FIG. 4E is a schematic cross-sectional view showing a stiffener lamination step in a method for manufacturing a printed circuit board according to an embodiment of the present invention.

In the stiffener lamination step, as shown in FIG. 4E, a stiffener 8 is laminated on the outer surface of the shielding layer 7. The method of laminating the stiffener 8 is not particularly limited, and for example, a bonding method with an adhesive may be used. The average thickness of an adhesive layer that bonds the shielding layer 7 to the stiffener 8 can be, for example, 10 to 70 μm.

<Advantages>

In the method for manufacturing a printed circuit board, the printed circuit board 1 can be easily and reliably manufactured.

[Other Embodiments]

It should be considered that the embodiments disclosed this time are illustrative and non-restrictive in all aspects. The scope of the present invention is not limited to the embodiments described above but is defined by the appended claims, and is intended to include all modifications within the meaning and scope equivalent to those of the claims.

For example, the printed circuit board may not necessarily have flexibility. Furthermore, it is not always necessary to use the printed circuit board in a folded state in an electronic component. Moreover, the printed circuit board does not necessarily have conductive patterns on both surfaces of a base film, and a conductive pattern may be formed on only one surface of the base film.

As long as the printed circuit board includes a shielding layer containing a liquid crystal polymer as a main component in a region covering an opening of an airtight case, the position at which the shielding layer is placed in the printed circuit board is not limited. That is, for example, the shielding layer may substitute for a base film or may substitute for a coverlay. Furthermore, the shielding layer may be provided as a different layer from an impedance adjustment layer, base film, or coverlay. In addition, the printed circuit board does not necessarily include only one shielding layer, but may include a plurality of shielding layers.

The printed circuit board may not necessarily include a stiffener. Furthermore, even in the case where the printed circuit board includes a stiffener, the stiffener is not necessarily disposed on a shielding layer, and another layer may be interposed between the stiffener and the shielding layer.

1 printed circuit board
2 base film
3a, 3b conductive pattern
4a, 4b coverlay
5a, 5b adhesive layer
6a, 6b insulating layer
7 shielding layer
8 stiffener
11 electronic component
12 airtight case
14 mounting member
15 screw
21a, 21b metal foil
X opening

The invention claimed is:

1. A printed circuit board, which is configured to be disposed on an inner surface of an airtight case having an opening so as to hermetically cover the opening, comprising:
   a base film having insulation properties and flexibility,
   a pair of conductive patterns disposed on both surfaces of the base film,
   a pair of coverlays disposed on outer surfaces of the pair of conductive patterns, and
   a shielding layer disposed on an outer surface of one of the pair of coverlays,
   wherein the shielding layer contains a liquid crystal polymer as a main component and is placed at least in a region covering the opening.

2. The printed circuit board according to claim 1, wherein the shielding layer has an average thickness of 20 to 500 μm.

3. The printed circuit board according to claim 1, further comprising a reinforcing sheet disposed on a surface of the shielding layer opposite to the side that is disposed on the airtight case.

4. The printed circuit board according to claim 1, wherein the shielding layer acts as an impedance adjustment layer.

5. The printed circuit board according to claim 1, wherein the shielding layer is placed at a position where the distance from an outer surface of the shielding layer facing the inner surface of the airtight case is 300 μm or less.

6. The printed circuit board according to claim 1, wherein the printed circuit board includes one or a plurality of polyimide layers located between an outer surface to be disposed on the inner surface of the airtight case and the shielding layer, and the one or a plurality of polyimide layers have a total average thickness of 100 μm or less.

7. An electronic component comprising:
   an airtight case having an opening; and
   a printed circuit board disposed on an inner surface of the airtight case so as to hermetically cover the opening,
   wherein the printed circuit board includes a base film having insulation properties and flexibility,
   a pair of conductive patterns disposed on both surfaces of the base film,
   a pair of coverlays disposed on outer surfaces of the pair of conductive patterns, and
   a shielding layer disposed on an outer surface of one of the pair of coverlays, wherein the shielding layer contains a liquid crystal polymer as a main component and is placed at least in a region covering the opening.

* * * * *